US006838715B1

(12) United States Patent
Bencuya et al.

(10) Patent No.: US 6,838,715 B1
(45) Date of Patent: Jan. 4, 2005

(54) CMOS IMAGE SENSOR ARRANGEMENT WITH REDUCED PIXEL LIGHT SHADOWING

(75) Inventors: Selim Bencuya, Irvine, CA (US); Richard Mann, Torrance, CA (US); Erik Stauber, San Diego, CA (US)

(73) Assignee: ESS Technology, Inc., Fremont, CA (US)

( * ) Notice: Subject to any disclaimer, the term of this patent is extended or adjusted under 35 U.S.C. 154(b) by 25 days.

(21) Appl. No.: 10/425,488

(22) Filed: Apr. 29, 2003

Related U.S. Application Data (60) Provisional application No. 60/376,750, filed on Apr. 30, 2002.

(51) Int. Cl.[7] .............................................. H01L 31/062
(52) U.S. Cl. ...................... 257/291; 257/184; 257/187; 257/203; 257/292; 257/293; 257/433; 257/461; 257/462; 257/929
(58) Field of Search .................................. 257/184, 187, 257/203, 221, 291–293, 462, 929

(56) References Cited

U.S. PATENT DOCUMENTS

| | | | | |
|---|---|---|---|---|
| 6,171,885 B1 | * | 1/2001 | Fan et al. | 438/70 |
| 6,242,769 B1 | * | 6/2001 | Chang et al. | 257/291 |

* cited by examiner

*Primary Examiner*—Long Pham
*Assistant Examiner*—Wai-Sing Louie
(74) *Attorney, Agent, or Firm*—Farjami & Farjami LLP (57) ABSTRACT

An exemplary CMOS image sensor comprises a plurality of pixels arranged in an array. The plurality of pixels includes a first pixel proximate an optical center of the array, and a second pixel proximate a peripheral edge of the array. The CMOS image sensor further comprises a first metal interconnect segment associated with the first pixel situated in a first metal layer, and a second metal interconnect segment associated with the second pixel situated in the first metal layer. The second metal interconnect segment is shifted closer to the optical center of the array than the first metal interconnect segment so that the second metal interconnect segment approximately aligns with a principle ray angle incident the second pixel, thereby reducing pixel light shadowing.

20 Claims, 6 Drawing Sheets

CMOS IMAGE SENSOR ARRANGEMENT WITH REDUCED PIXEL LIGHT SHADOWING

RELATED APPLICATIONS

The present application claims the benefit of U.S. provisional patent application Ser. No. 60/376,750, filed on Apr. 30, 2002, the disclosure of which is hereby fully incorporated by reference in the present application.

BACKGROUND OF THE INVENTION

1. Field of the Invention

The present invention is generally in the field of solid state imaging devices. More specifically, the invention is in the field of Complementary Metal Oxide Semiconductor ("CMOS") imaging devices.

2. Related Art

Solid-state image sensors (also known as "solid-state imagers," "image sensors," and "imagers") have broad applications in many areas and in a number of fields. Solid-state image sensors convert a received image into a signal indicative of the received image. Examples of solid-state image sensors include charge coupled devices ("CCD"), photodiode arrays, charge injection devices ("CID"), hybrid focal plane arrays and CMOS imaging devices (also known as "CMOS image sensors" or "CMOS imaging arrays").

Solid-state image sensors are fabricated from semiconductor materials, such as silicon or gallium arsenide, and comprise imaging arrays of light detecting, i.e., photosensitive, elements (also known as "photodetectors" or "photoreceptors") interconnected to generate analog signals representative of an image illuminating the device. A typical imaging array comprises a number of photodetectors arranged into rows and columns, each photodetector generating photo-charges. The photo-charges are the result of photons striking the surface of the semiconductor material of the photodetector, and generating free charge carriers (electron-hole pairs) in an amount linearly proportional to the incident photon radiation. The photo-charges from each pixel are converted to a "charge signal" which is an electrical potential representative of the energy level reflected from a respective portion of the object and received by the solid-state image sensor. The resulting signal or potential is read and processed by video/image processing circuitry to create a signal representation of the image.

In recent years, CMOS image sensors have become a practical implementation option for imagers and provide cost and power advantages over other technologies such as CCD or CID. A conventional CMOS image sensor is typically structured as an imaging array of pixels, each pixel including a photodetector and a transistor region, and as discussed above, each pixel converts the incoming light into an electronic signal. In a typical three-transistor active pixel design for a CMOS image sensor, each pixel includes four wires (or "metal interconnect lines" or "metal interconnect segments") and three transistors, namely, a reset transistor, a source-follower transistor, and a select transistor. Two metal interconnect segments are disposed horizontally to provide row selection for either resetting the pixel or reading the pixel. Two other metal interconnect segments are disposed vertically (or substantially perpendicular to the first two metal interconnect segments) to provide column selection for both reading and resetting the pixel.

In conventional CMOS image sensors, the arrangement of the pixel's structures, including the relative positioning of the photodetector, the transistor region, and the metal interconnect segments, as well other structural elements, has presented problems. A major problem which conventional CMOS image sensors exhibit is pixel light shadowing (also referred to as "geometric shadowing"). Pixel light shadowing is caused when the average ray or principal ray striking the pixel deviates significantly from normal (or perpendicular to the imaging array plane). Under these conditions, one or more of the pixel elements situated over the photodetector may block a significant amount of light from being directed at the photodetector. As a result, the brightness of the resulting image is significantly reduced, resulting in poor image quality. Moreover, the pixels situated at the periphery of the imaging array are significantly more susceptible to pixel light shadowing. As a result, the resulting images have significant and undesirable brightness falls off at the edges of the field of view. This problem is further exacerbated due to the loss of brightness at the edge of field of view common to most lens systems due to 1/Cosine effects. Consequently, the resulting image exhibits unacceptable signal-to-noise (SNR), particularly at the corners of the images. These problems are further aggravated under low light conditions.

Accordingly, there is a strong need in the art for a CMOS image sensor arrangement and method for arranging image sensor elements, which significantly reduces pixel light shadowing.

SUMMARY OF THE INVENTION

The present invention is directed to a CMOS image sensor arrangement and method for arranging image sensor elements which significantly reduce pixel light shadowing. In one exemplary embodiment, the CMOS image sensor comprises a plurality of pixels arranged in an array. The plurality of pixels includes a first pixel proximate an optical center of the array, and a second pixel proximate a peripheral edge of the array. The CMOS image sensor further comprises a first metal interconnect segment associated with the first pixel situated in a first metal layer, and a second metal interconnect segment associated with the second pixel situated in the first metal layer. In accordance with the present invention, the second metal interconnect segment is shifted closer to the optical center of the array than the first metal interconnect segment so that the second metal interconnect segment approximately aligns with a principle ray angle incident the second pixel. The photodiode elements and transistor elements of the pixels of the array remain on a fixed pitch. However, the metal interconnect segments and other pixel elements associated with the pixels of the array are positioned on a variable pitch such that these metal interconnect segments and pixel elements are shifted towards the optical center in proportion to the distance of the metal interconnect segment or associated pixel element from the optical center and in proportion to the distance of the metal interconnect segment or pixel element from the surface of the photodiode.

Thus metal interconnect segments and pixel elements can be positioned at a designated offset position so that the shifts of the metal interconnect segments and pixel elements approximately align to the principle ray angle of the lens incident to the pixel in each location in the array, thereby substantially reducing pixel light shadowing. Proximate the optical center where the principle ray angle is aligned substantially perpendicular to the wafer, the metal interconnect segments are all aligned above the transistor and isolation regions of the pixel leaving the photodiode unobscured to collecting light. In comparison, proximate the corners of the array or proximate the periphery of the array, the metal interconnect segments associated with those pixels are shifted so as to appear to be "tilted" towards the optical center of the array to thereby align the light collection path with the principle ray angle incident the respective pixels. Such tilts can be typically in the range of 15 to 25 degrees for certain lenses.

This offset positioning (or shift) of the interconnect elements and other pixel elements towards the optical center of the array progressively increases in small intervals at the subsequent pixel placements in proportion to the distance of the pixel from the optical center of the array. These shifts can be applied along a horizontal dimension of the array, a vertical dimension of the array, or along both a horizontal and vertical dimension of the array. With this arrangement the transistor and diode elements of the pixel are always placed in positions corresponding to a fixed pixel pitch interval.

According to another embodiment, the CMOS image sensor further comprises a third metal interconnect associated with the first pixel, and a fourth metal interconnect segment associated with the second pixel, where the third and fourth metal interconnect segment are situated in a second metal layer. In this case, the fourth metal interconnect segment is shifted closer to the optical center than the third metal interconnect segment. Where the first metal layer is situated below the second metal layer, the fourth metal interconnect segment is shifted closer to the optical center than the second metal interconnect segment. These metal interconnect elements may comprise metal lines and vertical via structures to connect the different layers of metal together. In certain embodiments, a first via is situated between the first metal interconnect segment and the third metal interconnect segment, and a second via is situated between the second metal interconnect segment and the fourth metal interconnect segment.

According to another embodiment, the CMOS image sensor further comprises a first micro lens associated with the first pixel, and a second micro lens associated with the second pixel. In this particular embodiment, a second micro lens is shifted closer to the optical center than the first micro lens.

According to another embodiment, the CMOS image sensor further comprises a first color filter associated with the first pixel and a second color filter associated with the second pixel. In this particular embodiment, a second color filter is shifted closer to the optical center than the first color filler.

In another embodiment, the invention is a method for arranging the pixel elements according to the above-described arrangement. Other features and advantages of the present invention will become more readily apparent to those of ordinary skill in the art after reviewing the following detailed description and accompanying drawings.

DETAILED DESCRIPTION OF THE INVENTION

The present invention is directed to a CMOS image sensor arrangement and method for arranging image sensor elements. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings. It is noted that, for ease of illustration, the various elements and dimensions shown in the drawings are not drawn to scale.

Figure 1A:
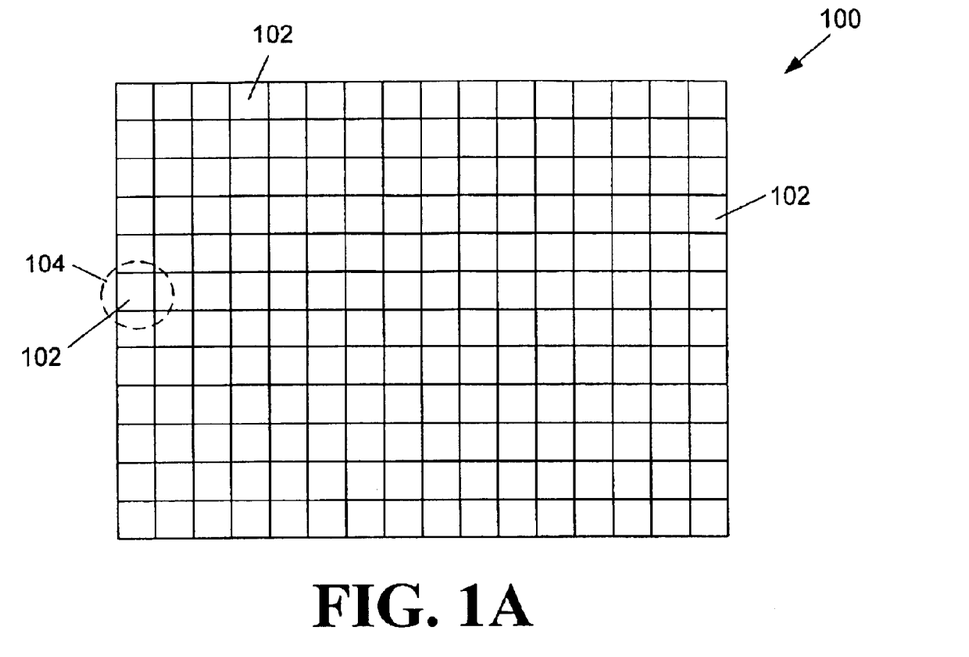
FIG. 1A illustrates a top view of a typical CMOS imaging array.

Referring first to FIG. 1A, a top view of a portion of CMOS imaging array 100 is shown including a plurality of pixels 102, arranged into rows and columns, each pixel 102 generating photo-charges. The photo-charges generated by pixels 102 are the result of photons striking the surface of the semiconductor material of the photodetector, and generating free charge carriers (electron-hole pairs) in an amount linearly proportional to the incident photon radiation. Pixel 102 in region 104 of imaging array 100 will now be described with reference to FIG. 1B.

Figure 1B:
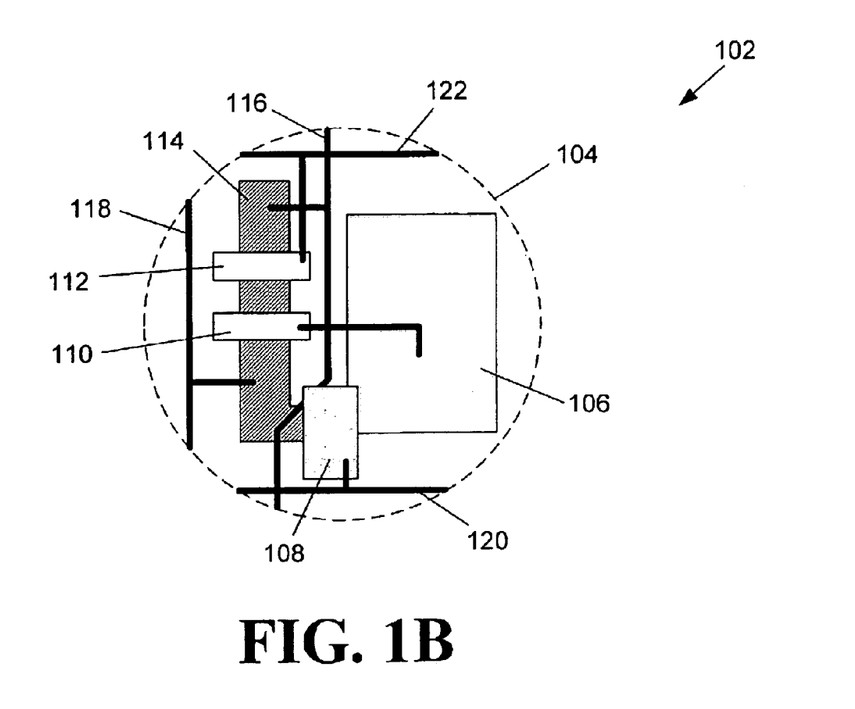
FIG. 1B illustrates an enlarged view pixel of FIG. 1A.

In FIG. 1B, region 104 and pixel 102 are shown in an enlarged view. Pixel 102 illustrates a three-transistor active pixel design including photodetector 106 (such as a photodiode), reset transistor 108, source-follower transistor 110, and select transistor 112. The active area of transistors 108, 110 and 112 is depicted as region 114 in FIG. 1B. In an effort to avoid blocking photodetector 106, multiple layer metal construction is typically used in CMOS imaging arrays. For example, in FIG. 1B, metal interconnect segments 116 and 118 are vertically positioned and may, for example, be provided in metal layer two. Metal interconnect segments 120 and 122 are horizontally positioned and may, for example, be provided in metal layer three and metal layer one, respectively. Metal interconnect segments 116 and 118 may be used to provide column selection for both reading and resetting of photodetector 106. Metal interconnect segment 120 may be used to provide resetting of photodetector 106, while metal interconnect segment 122 may be used to provide reading of photodetector 106.

Figure 2A:
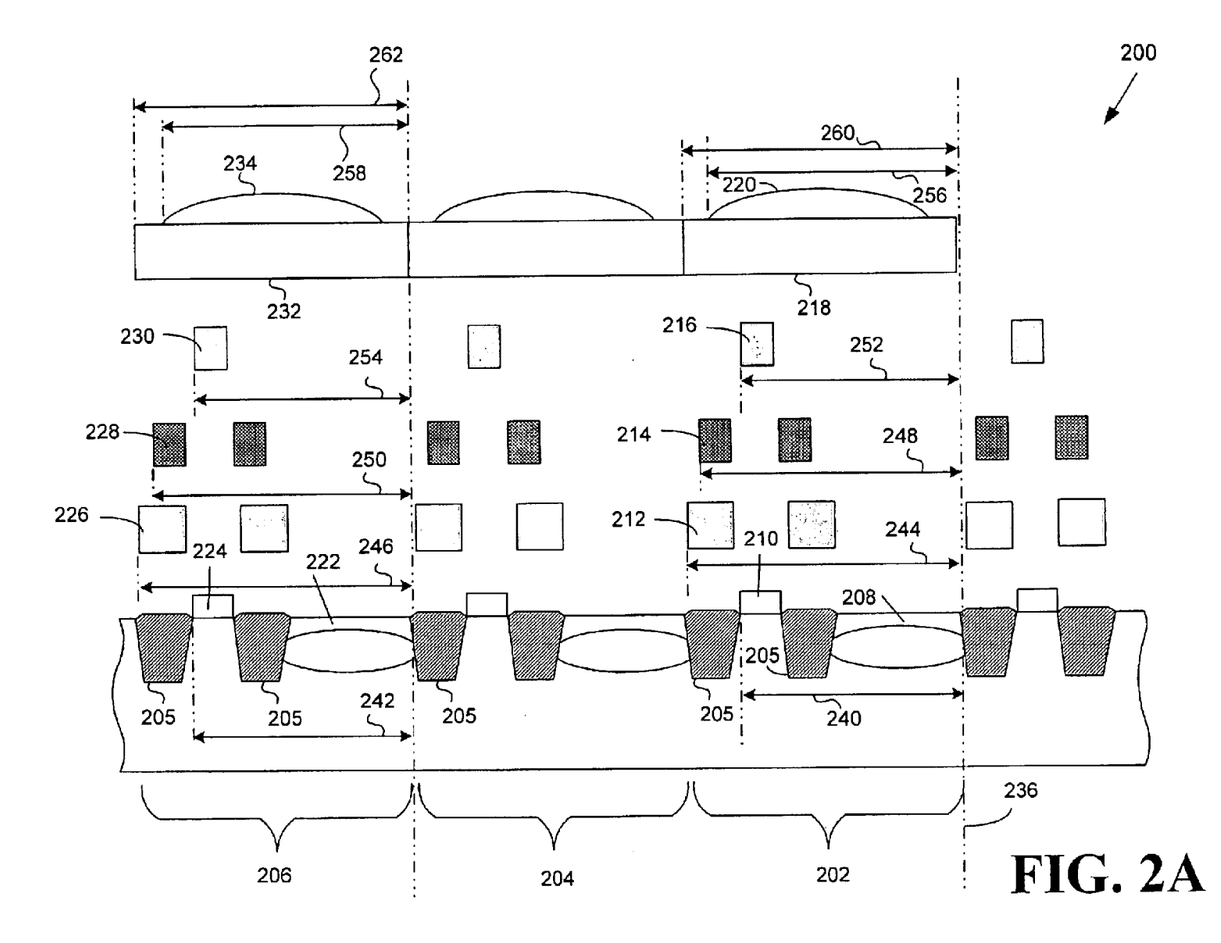
FIG. 2A illustrates a cross sectional-view of a known CMOS imaging array.

Referring now to FIG. 2A, a cross sectional-view of known CMOS imaging array 200 is generally shown. Known CMOS imaging array 200 includes pixels 202, 204 and 206, wherein pixel 202 is situated in closer proximity to optical center axis 236 than pixel 206. Optical center axis 236 of imaging array 200 corresponds to a reference line perpendicular to the surface plane of CMOS imaging array 200, intersecting a center point of CMOS imaging array 200. By way of illustration, pixel 202 may be situated adjacent or proximate to optical center axis 236, and pixel 206 may be at or proximate the edge or periphery of known CMOS imaging array 200. Each pixel 202 and 206 comprises respective photodetector 208 and 224, transistor region 210 and 224, metal one interconnect segments 212 and 226, metal two interconnect segments 214 and 228, metal three interconnect segment 216 and 230, color filter 218 and 232 and micro lens 220 and 234.

Transistor regions 210 and 224 represent an active pixel design employing a reset transistor, a source follower transistor and a select transistor, as described above in conjunction with FIG. 1B. Respective isolation elements 205 are positioned between transistor regions and photodetectors, e.g., between transistor region 210 and photodetector 108, and between adjacent pixels, e.g., between pixel 202 and 204.

In known CMOS imaging array 200, metal one interconnect segments 212 and 226, metal two interconnect segments 214 and 228, and metal three interconnect segments 216 and 230 are routed over respective transistor regions 210 and 224 and isolations regions 205 of pixels 202 and 206, respectively, to provide electrical connectivity for reading and/or resetting operations involving photodetectors 208 and 222, respectively, as discussed above.

Color filters 218 and 232 allow light of only specific wavelengths to be transmitted to respective photodetectors 208 and 222. With the use of color filters, such as filters 218 and 232, known CMOS imaging array 200 may be used to capture color images. Typically, such color filters are arranged in a repeating Bayer pattern of red, green, and blue filters. Micro lens 220 and 234 are typically formed of a clear polymer and are situated over respective color filters 218 and 232 to redirect light toward respective photodetectors 208 and 222.

Known CMOS imaging array 200 is configured in a conventional arrangement where each pixel, including pixels 202, 204 and 206, are identical in layout and placement of its pixel elements, including corresponding metal interconnect segments, color filters and micro lenses. Stated differently, each pixel 202, 204 and 206 and its associated pixel elements, i.e., metal interconnect segments, color filter, and micro lens, is identically arranged with a fixed pitch. Thus, dimension 240 defining the placement of the transistor region 210 of pixel 202 is the same as dimension 242 defining the placement of transistor region 224 of pixel 206. Likewise the dimension 244 and dimension 246 (corresponding to metal one interconnect segments 212 and 226, respectively) are the same, dimension 248 and 250 (corresponding to metal two interconnect segments 214 and 228, respectively) are the same, dimension 252 and 254 (corresponding to metal three interconnect segments 216 and 230, respectively) are the same, dimension 260 and 262 (corresponding to color filters 218 and 232, respectively) are the same, and dimension 256 and 258 (corresponding to micro lenses 220 and 234, respectively) are the same. This identical layout scheme is carried out in both the horizontal and vertical dimensions in known CMOS imaging array 200.

Figure 2B:
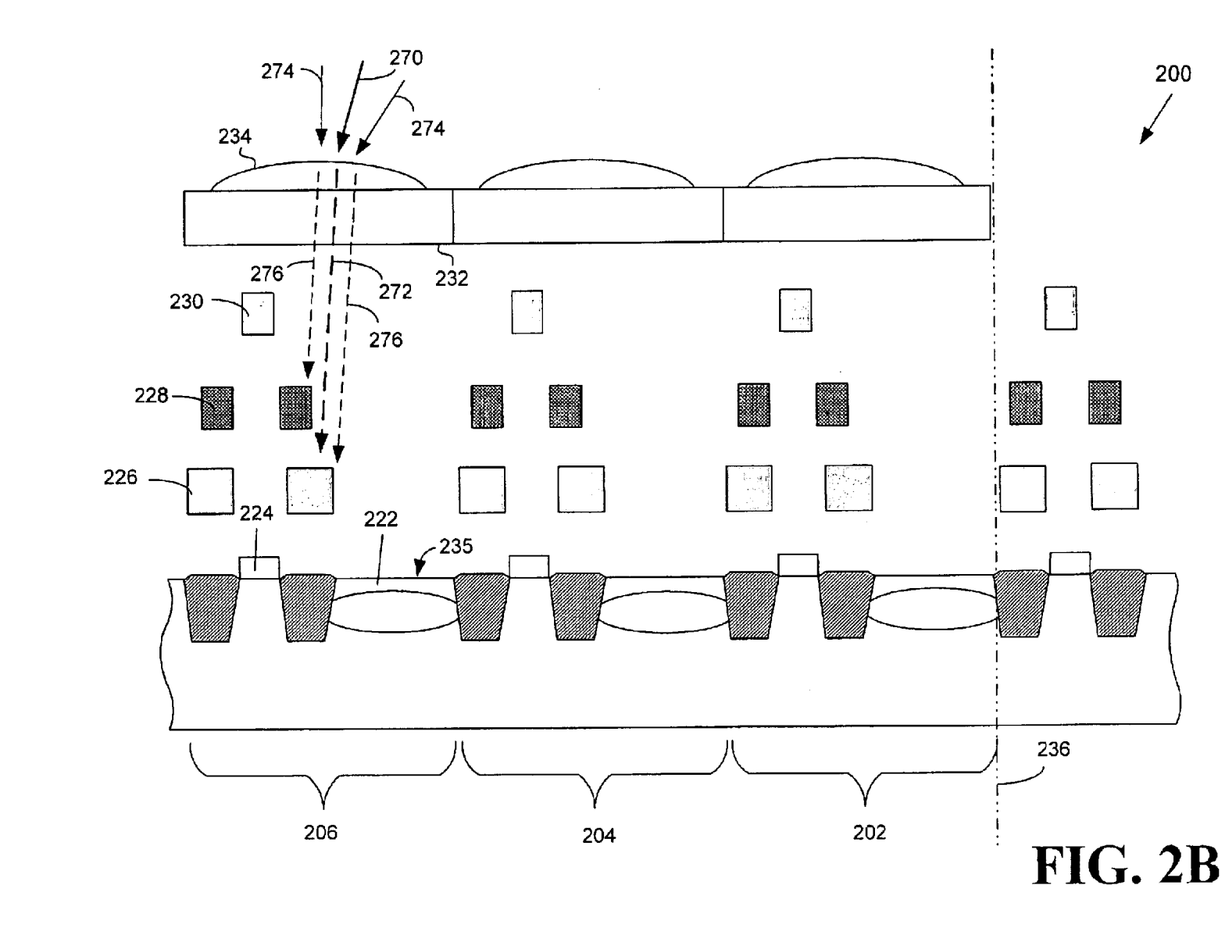
FIG. 2B illustrates the effect of a non-perpendicular principle ray upon a known CMOS imaging array.

This arrangement of pixel elements in known CMOS imaging array 200 results in significant pixel light shadowing in the resulting image, particularly under low light conditions. As discussed above, pixel light shadowing is caused when the average ray or principal ray striking the pixel deviates significantly from normal (or perpendicular to the imaging array plane). Referring now to FIG. 2B, principal ray 270 and ray bundle 274 are shown having incident angles significantly away from normal or away from perpendicular to imaging array surface 235 of pixel 206. Ray 270 and ray bundle 274 are redirected by micro lens 234 and passed through color filter 232. However, because of the initial incident angles of ray 270 and ray bundle 274, redirected rays 272 and 276 do not strike photodetector 222 but are blocked by pixel elements situated over photodetector 222, including one or more of metal one interconnect segments 226, metal two interconnect segments 228 and metal three interconnect segment 230. A significant amount of illumination will be blocked and prevented from striking photodetector 222 in this manner, resulting in significantly reduced brightness of the resulting image produced by pixel 206.

Moreover, light incident pixels proximate optical center axis 236, e.g., pixel 202, strike surface 235 of those pixels at angles near normal, whereas, pixels near the edge or periphery of known CMOS imaging array 200, i.e., near the edge of the field of view of the optical system, e.g., pixel 206, experience an average ray angle which deviates significantly from normal. The resulting image produced by CMOS imaging array 200 thus exhibits significant pixel light shadowing as pixels proximate the edges of the field of view will produce images that have significant and undesirable brightness falls off. This problem is further exacerbated due to the loss of brightness at the edge of field of view common to most lens systems due to 1/Cosine effects. Consequently, the resulting image exhibits unacceptable signal-to-noise (SNR), particularly at the corners of the images. These problems are further aggravated under low light conditions.

Furthermore, as pixels are scaled to smaller pitches to reduced device size, pixel light shadowing becomes even more pronounced as the available area for the photodetector element is reduced. The conventional approach to addressing this problem has been to implement telecentric lenses. Telecentric lenses, however, require more optical elements, thereby increasing the height of the lens, which is undesirable in many applications, such as pocket-sized or portable electronic devices. In addition, the constraints on the optical design of telecentric lenses can result in adverse reduction in Modulation Transfer Function ("MTF"), contrast and other important image quality properties. Finally, telecentric lenses add undesirable increased costs to the camera system, rendering telecentric lenses unpractical in many applications.

Figure 3A:
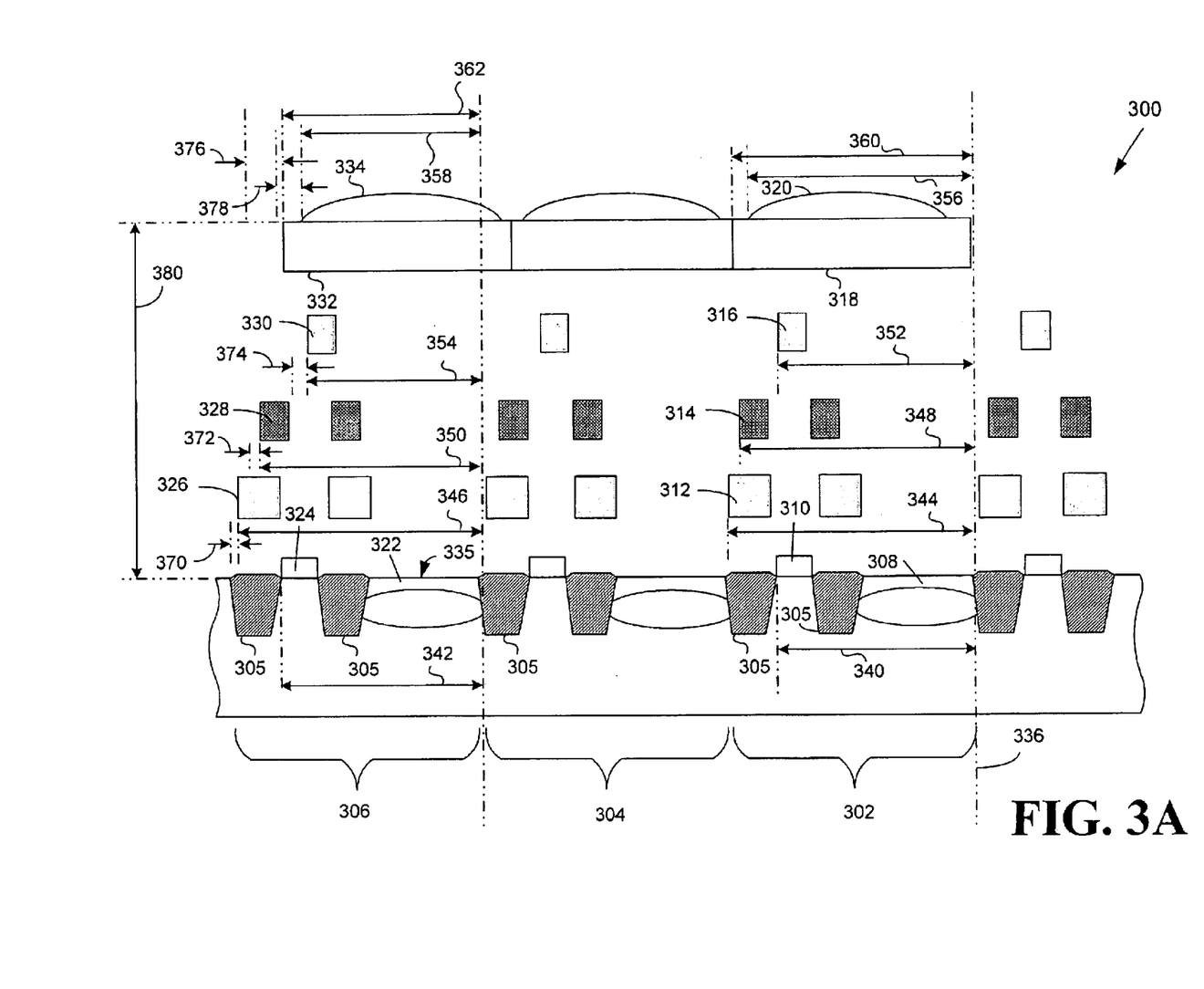
FIG. 3A illustrates a cross sectional-view of a CMOS imaging array in accordance with one embodiment of the present invention.

Referring now to FIG. 3A, CMOS imaging array 300 which addresses and resolves pixel light shadowing in a simplified and cost-effective manner according to one embodiment of the invention is shown. Pixels 302, 304 and 306 are shown as part of CMOS imaging array 300 for illustrative purposes, although CMOS imaging array 300 typically include a larger number of pixels. As shown in FIG. 3A, pixel 302 is situated in closer proximity to optical center axis 336 than pixel 306. Optical center axis 336 of imaging array 300 corresponds to a reference line perpendicular to the surface plane of CMOS imaging array 300, intersecting a center point of CMOS imaging array 300. By way of illustration, pixel 302 may be situated adjacent or proximate to optical center axis 336, and pixel 306 may be at or proximate the edge or periphery of CMOS imaging array 300.

Each pixel 302 and 306 comprises respective photodetector 308 and 324, transistor region 310 and 324, metal one interconnect segments 312 and 326, metal two interconnect segments 314 and 328, metal three interconnect segment 316 and 330, color filter 318 and 332 and micro lens 320 and 334. As described more fully below, the particular arrangement and placement of metal one interconnect segments 312 and 326, metal two interconnect segments 314 and 328, metal three interconnect segment 316 and 330, color filters 318 and 332 and micro lenses 320 and 334 of pixels 302 and 306, respectively, results in significantly reduced pixel light shadowing and superior resulting images.

Transistor regions 310 and 324 represent an active pixel design employing a reset transistor, a source follower transistor and a select transistor, as described above. Respective isolation elements 305 are positioned between transistor regions and photodetectors, e.g., between transistor region 310 and photodetector 308, and between adjacent pixels, e.g., between pixel 302 and 304. By way of illustration, isolation elements 305 may comprise shallow trench isolation regions, for example, although other isolation structures may also be used.

Metal one interconnect segments 312 and 326, metal two interconnect segments 314 and 328, and metal three interconnect segments 316 and 330 associated with pixels 302 and 306, respectively, provide electrical connectivity for reading and/or resetting operations involving photodetectors 308 and 322, respectively, as discussed above. Although not shown in FIG. 3A for ease of illustration, vias are typically positioned to provide vertical interconnections between metal levels corresponding to metal one interconnect segments 312 and 326, metal two interconnect segments 314 and 328, and metal three interconnect segments 316 and 330. Also not shown in FIG. 3A for ease of illustration is a transparent dielectric that supports and encapsulates metal one interconnect segments 312 and 326, metal two interconnect segments 314 and 328, and metal three interconnect segments 316 and 330.

Color filters 318 and 332 allow light of only specific wavelengths to be transmitted to respective photodetectors 318 and 332. With the use of color filters, such as filters 318 and 332, CMOS imaging array 300 may be used to capture color images. Typically, such color filters are arranged in a repeating Bayer pattern of red, green, and blue filters. Micro lens 320 and 334 are typically formed of a clear polymer and are situated over respective color filters 318 and 332 to redirect light toward respective photodetectors 308 and 322.

In accordance with the present invention, the pixel elements, i.e., metal interconnect segments, color filter, micro lens, etc., associated with one or more pixels in CMOS imaging array 300 are physically shifted towards optical center axis 336 in order to approximately align with the principle ray angle incident each pixel. It is noted that the positioning and arrangement of photodetectors 308 and 322 and transistor regions 310 and 324 of pixels 302 and 306, respectively, are identical and have a fixed pitch. Thus, dimension 340 and 342 are the same.

Figure 4:
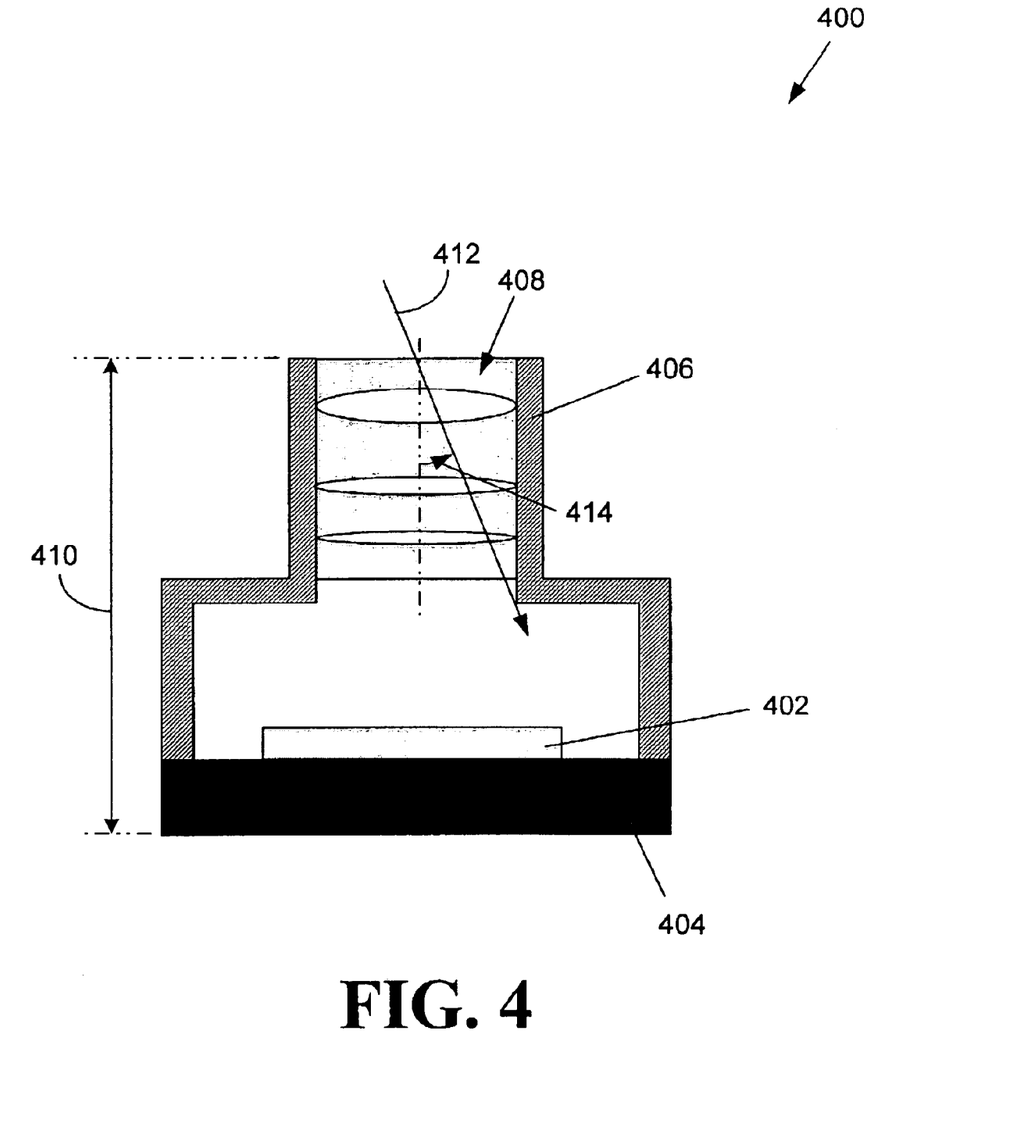
FIG. 4 illustrates a simplified cross-sectional view of camera system in accordance with one embodiment of the present invention.

Referring to FIG. 4, a simplified cross-sectional view of camera system 400 is shown including image sensor 402 situated on substrate 404, where, for example, image sensor 402 corresponds to CMOS imaging array 300 of FIG. 3A. Lens holder 406 is positioned over substrate 402 and houses lens assembly 408. As discussed above, in pocket-sized and portable electronic devices, it is desirable to reduce height 410 of camera system 400. Thus, maximum principal ray 412 and its incident angle 414 are dependent upon on the various physical dimensions of camera system 400 as well as the position of image sensor 402 on substrate 404.

Continuing with FIG. 3A, the layout and design of CMOS imaging array 300 can be carried out using a computer program executed on a computer system. For example, the maximum principle ray angle for a particular lens system may be determined by modeling the optical system and pixel performance on the computer system. Once the maximum principle ray angle is determined, the various pixel elements for one or more pixels of CMOS imaging array 300 are shifted toward optical center axis 336 to approximately align with the principle ray angle. According to one embodiment, shifts are applied by using the maximum design grid supported as described more fully below.

By way of illustration, a 22-degree maximum principle ray angle for an f2.8 lens with a +/−10-degree field of view may be defined for a particular camera system employing CMOS imaging array 300. In accordance with invention, the vertical structure of metal interconnect segments, e.g., metal interconnect segments 312, 314, 316, 326, 328, and 330, and the principle ray angle are used to define a required offset or shift in the placement of each of the metal interconnect segments 312, 314, 316, 326, 328, and 330, as well as color filters 318 and 332 and micro lenses 320 and 334. This shift in the metal interconnect segments 312, 314, 316, 326, 328, and 330, filters 318 and 332 and micro lenses 320 and 334 is directed toward optical center axis 336, and, as shown more clearly below, results in significantly reduced blockage of incoming light from being directed at photodetectors 308 and 322.

The amount of shift for each pixel element is dependent upon the distance of the pixel element from surface 335 of the pixel, the distance of the pixel to optical center axis 336, and the principle ray angle. By way of example, suppose pixel 306 is situated at the extreme corner of CMOS imaging array 300, dimension 380 defining the distance between micro lens 334 and photodetector 322 is approximately 5 microns ($\mu$m), and the camera system has a principle ray angle of 20-degrees, micro lens 334 is shifted by amount 378 towards the optical center axis 336. Shift 378 is approximately 0.8 $\mu$m depending on the shape of the micro lens and its refractive power. The amount of offset or shift for pixel elements situated below micro lens 334, e.g., color filter 332, and metal interconnect segments 326, 328 and 330, are scaled to a lower value in proportion to the relative distance above photodetector 322. In the above example, where pixel 306 is at the extreme corner of CMOS imaging array 300, shift 376 for color filter 332 is approximately 0.64 $\mu$m, shift 374 for metal three interconnect segment 330 is approximately 0.48 $\mu$m, shift 372 for metal two interconnect segments 328 is approximately 0.32 $\mu$m, and shift 370 for metal one interconnect segments 326 is approximately 0.16 $\mu$m. Vias (not shown for ease of illustration) which connect metal interconnect segment are also shifted a proportional amount. Thus, any vias connecting metal three interconnect segment 300 and metal two interconnect segment 328 would be shifted by an intermediate value of 0.40 $\mu$m, and any vias connecting metal one interconnect segment 326 and metal two interconnect segment 328 would be shifted by an intermediate value of 0.24 $\mu$m. It is further noted that, contact structures of transistor regions 324 are not shifted, although the metal one interconnect segment 326 overlap of such contact structures is adjusted to provide adequate overlap between contacts structures and metal one interconnect segment 326 after shifting of metal one interconnect segment 326. Thus, transistor regions 324, photodetector 322, and its respective isolation regions 305 are not shifted.

According to one embodiment, shifts are applied in groups of pixels by an amount equivalent to the supported maximum design grid. For example, in 0.25 micron CMOS, the typical minimum design grid is 0.01 $\mu$m. By way of illustration, a VGA imaging array comprises 640 columns and 480 rows of pixels. The number of pixels in each shift group is determined after the maximum shift value is determined at the edge of the field of view, i.e., for pixels situated at the edge of CMOS imaging array 300, as described above. If, for example, the maximum shift for a pixel element at the edge or periphery of CMOS imaging array 300 is determined to be 0.8 μm, smaller shifts will be applied in increments of 0.01 μm based upon the radial distance from optical center axis 336. In the horizontal dimension, for example, there will be 80 groups of shifts, each group including 6 columns (or 6 pixels), each group further away from optical center axis 336 being shifted 0.01 closer to optical center axis 336. Shifts to the pixel elements are also applied in the vertical dimension of CMOS imaging array 300 in the manner described above.

In general, shifts are applied in greater magnitudes to pixels elements situated further away from optical center axis 336 than pixels structures situated closer to optical center axis 336. Thus, larger shifts will be applied to metal interconnect segments 326, 328 and 330 of pixel 306 than metal interconnect segments 312, 314 and 316 of pixel 302. Likewise, larger shifts will be applied to color filter 332 and micro lens 334 of pixel 306 than color filter 318 and micro lens 320 of pixel 302. Referring to metal one segment 326 of pixel 306, for example, shift 370 indicates that that metal one segment 326 is shifted closer to optical center axis 336 relative to pixel 306 than metal one segment 312 relative to pixel 302. Thus, dimension 344 of pixel 302 is greater than dimension 346 of pixel 306 by shift amount 370. Likewise, shift 372 indicates that metal two segment 328 of pixel 306 is shifted closer to optical center axis 336 than metal two segment 314 of pixel 302, and shift 374 indicates that metal three segment 330 of pixel 306 is shifted closer to optical center axis 336 than metal three segment 316 of pixel 302. Furthermore, shift 376 indicates that color filter 332 of pixel 306 is shifted closer to optical center axis 336 than color filter 318 of pixel 302, and shift 378 indicates that micro lens 334 of pixel 306 is shifted closer to optical center axis 336 than micro lens 320 of pixel 302. It is noted that exceptions to this difference in shift amounts between pixels 302 and 306 arise when pixel elements of pixel 302 and 306 are in the same "shift group," in which case those pixel elements in the same shift group are shifted by the same amount, as noted above.

Also as discussed above, pixel elements situated further above pixel surface 335 are shifted by a greater amount in order to properly align the pixel elements with the principle ray angle. Thus, shift amount 378 is greater than shift amount 376. Shift amount 378 is in turn greater than shift amount 374; shift amount 374 is greater than shift amount 372; and shift amount 372 is greater than shift amount 370.

Figure 3B:
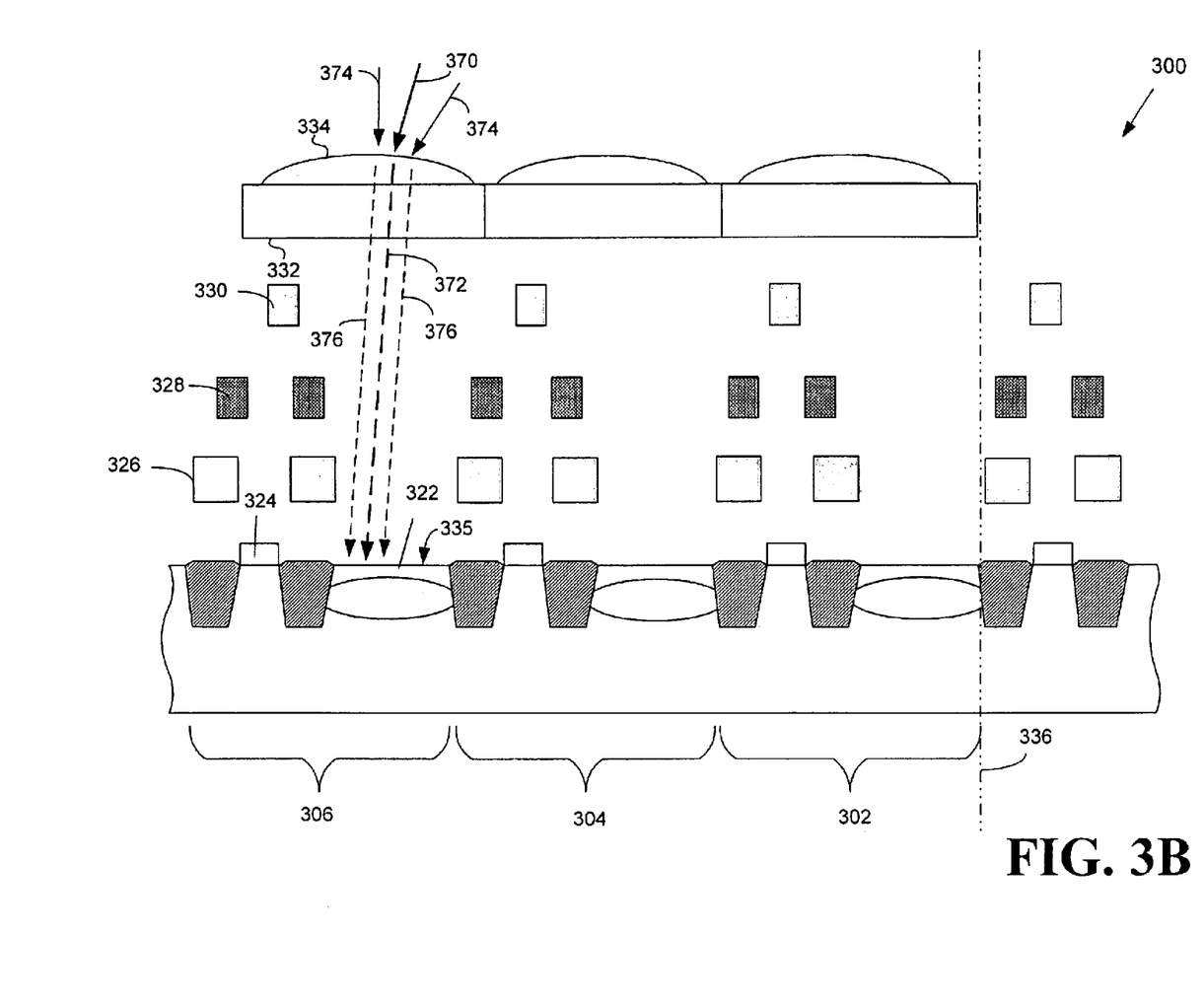
FIG. 3B illustrates the effect of a non-perpendicular principle ray upon a CMOS imaging array according to one embodiment of the present invention.

Referring to FIG. 3B, principal ray 370 and ray bundle 374 are shown having incident angles significantly away from normal or away from perpendicular to imaging array surface 335 of pixel 306. Ray 370 and ray bundle 374 are redirected by micro lens 334 and passed through color filter 332. Due to the particular arrangement of CMOS imaging array 300, redirected rays 372 and 376 of principal ray 370 and ray bundle 374 strike photodetector 322 but are not blocked by metal interconnect segment 326, 328 and 330 because each of metal interconnect segments 326, 328 and 330, color filter 332, and micro lens 334 have been shifted toward optical center axis 336 to approximately align with principle ray 370, as described above. As a result, camera performance is significantly increased, resulting in significant or complete elimination of pixel light shadowing at the edges of CMOS imaging array 300. According to one embodiment, 25%–50% increases in light collection at the edges of CMOS imaging array 300 is achieved. These benefits are achieved without resort to use of telecentric lenses and its associated disadvantages. Thus, lens size can be reduced, and lens performance is increased. Moreover, since the dimensional tolerance of the manufacturing process is several times greater than a minimum design grid, these small shift or offsets will not interfere with the normal wafer manufacturing process.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. For example, it is manifest that the shift amount values and the number of metal interconnect segments described above are merely exemplary and may be modified without departing from the scope and spirit of the invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, a CMOS image sensor arrangement and method for arranging image sensor elements with reduced pixel light shadowing has been described.

What is claimed is:

1. A CMOS image sensor comprising:
   a plurality of pixels arranged in an array;
   said plurality of pixels including a first pixel proximate an optical center of said array, and a second pixel proximate a peripheral edge of said array;
   a first metal interconnect segment associated with said first pixel; and
   a second metal interconnect segment associated with said second pixel, wherein said first metal interconnect segment and second metal interconnect segment are situated in a first metal layer, wherein said second metal interconnect segment is shifted closer to said optical center than said first metal interconnect segment so that said second metal interconnect segment approximately aligns with a principal ray angle incident said second pixel.

2. The CMOS image sensor of claim 1, wherein said second metal interconnect segment is shifted along a horizontal dimension of said array.

3. The CMOS image sensor of claim 1, wherein said second metal interconnect segment is shifted along a vertical dimension of said array.

4. The CMOS image sensor of claim 1, wherein said second metal interconnect segment is shifted along both a horizontal and a vertical dimension of said array.

5. The CMOS image sensor of claim 1, further comprising:
   a third metal interconnect segment associated with said first pixel;
   a fourth metal interconnect segment associated with said second pixel, wherein said third metal interconnect segment and said fourth metal interconnect segment are situated in second metal layer, wherein said fourth metal interconnect segment is shifted closer to said optical center than said third metal interconnect segment so that said fourth metal interconnect segment approximately aligns with said principal ray striking said second pixel.

6. The CMOS image sensor of claim 5, wherein said first metal layer is situated below said second metal layer, and wherein said fourth metal interconnect segment is shifted closer to said optical center than second metal interconnect segment.

7. The CMOS image sensor of claim 5, further comprising a first via situated between said first metal interconnect segment and said third metal interconnect segment.

8. The CMOS image sensor of claim 7, further comprising a second via situated between said second metal interconnect segment and said fourth metal interconnect segment.

9. The CMOS image sensor of claim 1, further comprising:
a first micro lens situated associated with said first pixel; and
a second micro lens associated with said second pixel, wherein said second micro lens is shifted closer to said optical center than said first micro lens.

10. The CMOS image sensor of claim 1, further comprising:
a first color filter associated with said first pixel; and
a second color filter associated with said second pixel, wherein said second color filter is shifted closer to said optical center than said first color filter.

11. A CMOS imaging array comprising:
a plurality of pixels arranged in rows and columns, each said pixel including a photodetector;
said plurality of pixels including a first pixel proximate an optical center of said CMOS imaging array, and a second pixel proximate a peripheral edge of said array;
a first metal interconnect segment associated with said first pixel; and
a second metal interconnect segment associated with said second pixel, wherein said first metal interconnect segment and second metal interconnect segment are situated in a first metal layer, wherein said second metal interconnect segment is shifted closer to said optical center than said first metal interconnect segment so that said second metal interconnect segment approximately aligns with a principal ray angle incident a photodetector of second pixel.

12. The CMOS imaging array of claim 11, wherein each of said first and second transistor regions comprises a respective reset transistor, a respective source-follower transistor, and a respective select transistor.

13. The CMOS imaging array of claim 11, wherein said photodetector is a photodiode.

14. The CMOS imaging array of claim 11, wherein said second metal interconnect segment is shifted along at least one of a horizontal or a vertical dimension of said array.

15. A CMOS imaging array of a lens system having a principle ray angle, said CMOS imaging array comprising:
a plurality of pixels including a first pixel, said first pixel having a photodetector;
at least a first micro lens element associated with said first pixel, said first micro lens element having a first offset position;
wherein said first pixel is situated at a periphery of said imaging array, and wherein said first micro lens element is fabricated at said first offset position so that said micro lens element approximately aligns with said principle ray angle incident said first pixel.

16. The CMOS imaging array of claim 15 further comprising:
a first color filter associated with said first pixel, said first color filter having a second offset position;
wherein said second offset position is derived by proportionally scaling said first offset position according to a distance of said first color filter above said photodetector relative to a distance of said first micro lens element above said photodetector;
wherein said first color filter is fabricated over said photodetector at said second offset position, and said first micro lens is fabricated over said first color filter.

17. The CMOS imaging array of claim 15 further comprising:
a first metal interconnect segment associated with said first pixel, said first metal interconnect segment having a second offset position;
wherein said second offset position is derived by proportionally scaling said first offset position according to a distance of said first metal interconnect segment above said photodetector relative to a distance of said first micro lens element above said photodetector;
wherein said first metal interconnect segment is fabricated over said photodetector at said second offset position.

18. The CMOS imaging array of claim 17, further comprising:
a second metal interconnect segment associated with said first pixel, said second metal interconnect segment having a third offset position;
wherein said third offset position is derived by proportionally scaling said first offset position according to a distance of said second metal interconnect segment above said photodetector relative to a distance of said first micro lens element above said photodetector.

19. The CMOS imaging array of claim 18, wherein said second metal interconnect segments is fabricated above said first metal interconnect segment, said third offset position in closer proximity to an optical center axis of said imaging array than said second offset position.

20. The CMOS imaging array of claim 19 further comprising:
a via fabricated between said first metal interconnect segment and said second metal interconnect segment, said via having a fourth offset position having an intermediate position between said second offset position and said third offset position.

* * * * *